US005835678A

United States Patent [19]

Li et al.

[11] Patent Number: 5,835,678

[45] Date of Patent: Nov. 10, 1998

[54] LIQUID VAPORIZER SYSTEM AND METHOD

[75] Inventors: Ting Kai Li, Somerville, N.J.; Dane C. Scott, Doylestown, Pa.

[73] Assignee: Emcore Corporation, Somerset, N.J.

[21] Appl. No.: 890,041

[22] Filed: Jul. 9, 1997

Related U.S. Application Data

[63] Continuation-in-part of Ser. No. 724,766, Oct. 3, 1996.

[51] Int. Cl.[6] .................... C23C 14/26

[52] U.S. Cl. .................... 392/401; 392/394; 392/399; 392/400; 118/726

[58] Field of Search .................... 118/726, 724; 392/394, 395, 399, 400, 401

[56] References Cited

U.S. PATENT DOCUMENTS

| | | | |
|---|---|---|---|
| 1,207,664 | 12/1916 | Thurston . | |
| 1,965,144 | 7/1934 | Kane et al. . | |
| 2,490,547 | 12/1949 | Schraner et al. . | |
| 2,728,321 | 12/1955 | Davis et al. . | |
| 2,925,329 | 2/1960 | Yost . | |
| 2,949,900 | 8/1960 | Bodine . | |
| 3,081,946 | 3/1963 | Soloff . | |
| 3,224,677 | 12/1965 | Schmidt et al. . | |
| 4,349,723 | 9/1982 | Swiatosz . | |
| 4,541,564 | 9/1985 | Berger et al. . | |
| 4,655,393 | 4/1987 | Berger . | |
| 4,986,216 | 1/1991 | Ohmori et al. . | |
| 4,997,677 | 3/1991 | Wang et al. . | |
| 5,002,928 | 3/1991 | Fukui et al. . | |
| 5,136,975 | 8/1992 | Bartholomew et al. . | |
| 5,204,314 | 4/1993 | Kirlin | 118/726 |
| 5,224,202 | 6/1993 | Arnold | 392/395 |
| 5,268,034 | 12/1993 | Vukelic . | |
| 5,361,800 | 11/1994 | Ewing . | |
| 5,362,328 | 11/1994 | Gardiner | 118/726 |
| 5,372,754 | 12/1994 | Ono . | |
| 5,383,970 | 1/1995 | Asaba | 118/726 |
| 5,421,895 | 6/1995 | Tsubouchi et al. . | |
| 5,425,810 | 6/1995 | Conti et al. . | |
| 5,447,568 | 9/1995 | Hayakawa | 118/724 |
| 5,451,260 | 9/1995 | Versteeg et al. . | |
| 5,505,782 | 4/1996 | Stauffer . | |

OTHER PUBLICATIONS

T. M. Byrne, P. W. Ing and C. G. Klem, "Semiconductor Furnace," IBM Technical Disclosure Bulletin, vol. 16, No. 5, Oct. 1973, pp. 1621–1622.

*Primary Examiner*—Richard Bueker
*Attorney, Agent, or Firm*—Lerner, David, Littenberg, Krumholz & Mentlik

[57] ABSTRACT

A liquid vaporizer apparatus and method for chemical vapor deposition of liquid solutions into a controlled atmosphere of a CVD reaction chamber. The apparatus comprises an atomizer, gas curtain, heated porous media disks and a carrier gas mixer. The invention provides for the independent control of temperature, pressure and precursor stoichiometry during the atomizing and vaporization process thereby rendering the precise precursor vapor quality and quantity required for a given application. The invention employs the use of removable porous media disks which may be varied according to the desired operating pressure and precursors. In operation, the apparatus provides for a liquid precursor to first be atomized into a mist using an ultrasonic nozzle, then vaporized by heated media disks, and mixed with a carrier gas, then forced into CVD reaction chamber.

12 Claims, 6 Drawing Sheets

LIQUID VAPORIZER SYSTEM AND METHOD

CROSS REFERENCE TO RELATED APPLICATIONS

This application is a continuation-in-part of pending U.S. application Ser. No. 08/724,766, filed on Oct. 3, 1996 pending.

FIELD OF THE INVENTION

The present invention relates to a chemical vapor deposition apparatus, and, more particularly, to a precursor liquid vaporization device having improved controllability of stoichiometry and rate of deposition of vaporized liquid precursor. The present invention further relates to a method of vaporizing liquid precursors.

BACKGROUND OF THE INVENTION

In the production of electronic microcircuits, many processing methods require that a reactive chemical or precursor be deposited onto a substrate wafer in an atmospherically-controlled heated reactor. These precursors typically must be converted from their solid or liquid state into their gaseous or vapor state because of the finer degree of uniformity achieved by vapor deposition. The precursor vapor, once generated, is directed into a reaction chamber where it passes over the substrate and subsequently deposits. This process is typically called chemical vapor deposition or "CVD". The deposited precursor chemical may form fine crystalline or amorphous layers which are required for creating microcircuits on the face of the substrate. In the CVD process, it is very important that the deposited chemical layers are pure and have uniform thicknesses throughout the surface of the substrate wafer in order for the resultant microcircuit to operate properly. The vaporized precursor must be carefully introduced into the reactor. The purity and uniformity of the deposited layers of precursors are determined by controlling and maintaining certain physical parameters such as temperature, stoichiometry, flow rate, and pressure during the formation of the precursor vapor. Many earlier attempts at conducting these processes have focused on vaporization of the precursor and introduction of some controllability of the above mentioned parameters, but have not satisfactorily overcome the problems associated therewith for some precursors.

For example, in some CVD processing systems the precursors are delivered to the reactor by bubbling a carrier gas through a supply of liquid precursor solution, which is usually heated. This device is known as a bubbler. These systems vaporize the precursor by employing a stream of carrier gas bubbled through a solution of precursor, which is usually temperature controlled, whereby the gas stream acts as a vehicle that actually carries precursor molecules into the vapor phase. The result is a vapor mixture of carrier gas and precursor.

Once generated, the vapor mixture is fed into the reactor. The flow of the carrier gas determines the quantity and concentration of precursor that is fed into the reactor. The problem with bubbler systems is that some precursors cannot be vaporized by simply blowing gas through a precursor solution. This is due to several physical properties of the precursor such as a very low vapor pressure, a high sublimation temperature or poor thermal stability at or near the sublimation point. Some systems employing bubblers have employed heated delivery lines and other devices to prevent the condensation of precursors that are reluctant to form vapors.

These heated devices can represent a source of impurities, and frequently cause thermal degradation of the precursor, which is normally intolerable for the production of CVD products. At the very least, the bubbler devices fall short of offering a sufficient degree of controllability for many precursor applications, and their use may result in irregular layer formation, impurity contamination, and inconsistent concentration of the delivered precursor vapor. In addition, bubblers cannot deliver high concentrations of precursors to processes that require high growth rates, because the carrier gas becomes saturated.

In an effort to overcome these problems, several attempts have been made to deliver precursors to CVD reactors by dissolving the precursors into an appropriate liquid solvent. The resulting solution is then delivered to a device that introduces the precursor to the reactor as either a liquid or as a vapor. These systems will normally vaporize the liquid precursor by either spraying the liquid through an orifice or forcing the material through a porous material that is heated. The resulting vaporized precursor is then forced out of the vaporizing device using a carrier gas. Some of these devices simply allow the liquid to be sprayed directly into the reaction chamber whereby the precursor droplets are converted into vapor by virtue of the reduced pressure and the elevated temperatures inside the chamber. Some of these devices also employ the use of an ultrasonic nozzle sprayer which disperse the liquid precursor into very fine liquid droplets.

As in the bubbler type systems, it is important to control various parameters such as temperature, pressure, stoichiometry, and flow rate. In addition, the liquid sprayer systems require further monitoring of the droplet size of the atomized liquid in order to provide a large evaporation surface area. Thus, the pore size of the porous heating material must be small enough to avoid these droplets and/or solid material entering the CVD reactor. The sprayer system also requires monitoring of the surface area of the porous heating surfaces, monitoring the temperature uniformity of the heating surface, and controlling the thermal energy provided to evaporate the precursors, as well as monitoring the liquid head pressure delivered up to the spray nozzle or orifice, and the exit pressure interfaced with the reaction chamber.

In current liquid vaporizer designs, many of the above-mentioned characteristics are interdependent and lack the overall control necessary to produce the desired vapor quality for some CVD applications. For example, a change in carrier gas velocity may cause a more rapid convective evaporation of the solvents in the liquid, thus lowering the vapor pressure of the other material present. This fluctuation in volatility, in turn, effects the stoichiometry of the precursor being introduced into the reaction chamber, and thus changes the concentration of precursor and carrier gas introduced into the reaction chamber.

Another problem with liquid vaporizers is that the atomized liquid droplets contact the walls of the vaporizing device where they will either condense into larger drops of liquid (if the walls are cool) or will thermally decompose (if the walls are excessively heated). This occurs because these systems lack the ability to control the direction of the atomized droplets once formed. These devices also are unable to separately control different segments of the vaporizer chamber so that condensation and thermolysis are avoided.

The present invention solves or substantially mitigates many of the problems described above when vaporizing liquid precursors, such as those used in a CVD processing system. The present invention provides for the evaporation of materials with a high solids content or low vapor pressure without the vapor precursor prematurely condensing before introduction into the reaction chamber as well as controlling stoichiometry by independently adjusting temperature, pressure and gas flow rate of the vaporization system, thus rendering the desired quality of vapor necessary for proper deposition required by the application. Therefore, the practice of the present invention overcomes the problems generally encountered in CVD processing because each variable present in the vaporization of liquid precursors is independently controllable.

Another problem with liquid vaporizers is that they do not provide for flexibility in terms of the overall volume of material that can be processed in any one application. Thus, a system which can be altered in a manner so as to provide control both from the point of view of stoichiometry and volume for such CVD processing systems is also highly desirable.

It is therefore an object of the present invention to minimize the interdependency of the many control factors by the isolation of atomization, heating, evaporation and gas flow amalgamation.

It is another object of this invention to provide for the evaporation of precursor materials with a high solids content or viscosity, or a low vapor pressure, and minimize the accumulation precursor build up within the atomizer.

It is yet another object of this invention to provide a method of delivering liquids to an evaporation media with a defined and consistent droplet size distribution independent of gas pressures and liquid pressures within the vaporization chamber.

It is still another object of this invention to provide a system which maintains the liquid components at a selectable temperature.

It is still another object of this invention to provide a system which minimizes in-line cleaning volume.

It is still a further object of this invention to provide a system that allows for the controlled heating of the evaporation media keeping the media temperature independent of the temperature of the liquid during atomization.

It is another object of the invention to provide a system which maintains a gas curtain around the atomized material to eliminate condensation and material deposition onto unheated areas.

It is still another object of this invention to provide a system which reduces purge volume of the system.

It is yet a further object of this invention to provide a system which utilizes easily replaceable evaporation media for easy cleaning.

It is still a further object of this invention to provide a system that allows for the blending of controlled quantities of preheated carrier gas with the evaporated precursor material.

It is still another object of this invention to provide a system that allows for the isolation of the blending gas and the atomization from the exit atmosphere.

It is yet another object of this invention to provide a system which allows for flexibility in connection with the application to specific processing requirements.

It is yet another object of this invention to provide a system which can be interchanged and/or converted for handling varying amounts of media depending upon the particular application desired therewith.

SUMMARY OF THE INVENTION

These and other objects have now been realized by the discovery of a modular liquid vaporizing apparatus comprising a housing including at lease one liquid precursor supply inlet and at least one vapor outlet, a removable atomizing module removably insertable into the housing at a location with respect to the at least one liquid precursor supply inlet whereby the atomizing module can convert the at least one liquid precursor to an atomized mist, and a removable heatable contact surface removably insertable into the housing at a location with respect to the removable atomizing module whereby the heatable contact surface can vaporize the atomized mist by direct contact therewith, whereby a vapor can be supplied from the at least one vapor outlet.

In accordance with one embodiment of the modular liquid vaporizing apparatus of the present invention, the apparatus includes a removable heating module removably insertable into the housing in association with the heatable contact surface whereby the heating module can raise the temperature of the heatable contact surface. In a preferred embodiment, the apparatus includes a plurality of the removable heatable contact surfaces and a corresponding plurality of the removable heating modules removably insertable in series within the housing for sequentially vaporizing the atomized mist. In a highly preferred embodiment, each of the plurality of heating modules includes a thermocouple for monitoring the temperature of the plurality of heating modules.

In accordance with another embodiment of the modular liquid vaporizing apparatus of the present invention, the heating module includes a flange for connecting the heating module to the atomizing module.

In accordance with another embodiment of the modular liquid vaporizing apparatus of the present invention, each of the plurality of heating modules includes a flange for connecting the plurality of heating modules to the atomizer module or to another of the plurality of heating modules.

In accordance with another embodiment of the modular liquid vaporizing apparatus of the present invention, the removable heatable contact surface comprises at least one porous contact member. In a preferred embodiment, the at least one porous contact member comprises at least one porous disk.

In accordance with another embodiment of the modular liquid vaporizing apparatus of the present invention, the plurality of removable heatable contact surfaces comprises a plurality of porous contact members. In a preferred embodiment, the plurality of porous contact members comprises a plurality of porous disks.

In another embodiment of the modular liquid vaporizing apparatus of the present invention, the plurality of porous contact members vary in porosity whereby a pressure gradient is formed between the housing and the at least one vapor outlet.

In accordance with another embodiment of the modular liquid vaporizing apparatus of the present invention, the apparatus includes means for connecting the at least one vapor outlet to a CVD reaction chamber.

In accordance with another embodiment of the modular liquid vaporizing apparatus of the present invention, the removable atomizing module comprises a removable ultrasonic module.

The liquid vaporizer apparatus of the present invention comprises a chamber having at least one liquid precursor supply inlet and at least one vapor outlet, atomizing means for converting the at least one liquid precursor into an atomized mist within the chamber, and a heated contact surface for vaporizing the atomized mist by direct contact within the chamber, whereby a vapor can be supplied from the at least one vapor outlet.

The chamber itself preferably includes inner walls, and the apparatus includes gas curtain means for introducing a curtain of gas into the chamber for preventing the atomized mist from contacting the inner wall of the chamber.

The heated contact surface preferably comprises at least one porous contact member, and preferably a plurality of porous contact members. In a preferred embodiment these are porous disks, preferably arranged in series, substantially perpendicularly aligned with respect to the atomizing means.

The apparatus of the present invention preferably includes carrier gas means for introducing a carrier gas proximate to the heated porous contact surface so as to mix the vapor with the barrier gas.

The chamber also preferably includes cooling means for cooling the atomizing means. In a preferred embodiment, the chamber includes at least one thermocouple for monitoring the inside temperature of the chamber and for controlling the cooling means thereby.

The apparatus of the present invention preferably includes carrier gas means as well as heating means for heating the heated contact surface, and preferably in which the chamber includes a jacket surrounding the heating means and associated with the carrier gas means for preheating the carrier gas prior to introduction proximate to the heated contact surface.

The apparatus of the present invention further preferably includes an outer evacuated jacket for insulating the chamber from ambient temperatures. The heated contact surface is also preferably removable.

In a plurality of porous contact surface members are used, and they preferably vary in porosity whereby a pressure gradient is formed between the chamber and the at least one vapor outlet.

The apparatus of the present invention preferably includes means for connecting the at least one vapor outlet to a chemical vapor deposition reaction chamber.

The apparatus of the present invention preferably includes a liquid vaporizer apparatus for supplying a vapor to a chemical vapor deposition reaction chamber comprising a chamber having at least one liquid supply liquid for supplying at least one liquid precursor to the chamber and at least one vapor outlet, an ultrasonic nozzle for converting the at least one liquid precursor into atomized mist within the chamber, and a heated contact surface for vaporizing the atomized mist by direct contact within the chamber, whereby a vapor can be supplied to the at least one vapor outlet.

The above-discussed problems associated with the prior art, as well as other shortcomings not mentioned, are resolved to a large extent through the use of the present invention. The present invention thus provides an apparatus for the vaporization of liquid precursor chemical reactants, preferably such as those generated for the purposes of chemical vapor deposition.

Illustratively, the present invention preferably consists of several independent modular subunits housed within a common structure. The first subunit is a device that provides for the delivered liquid precursor to be atomized into liquid droplets using an ultrasonic nozzle. The modular ultrasonic nozzle can be readily replaced by a different modular ultrasonic nozzle having a particularly desired frequency or other such property. The atomized precursor is then dispersed into an expansion zone immediately following the ultrasonic nozzle. This expansion is temperature and pressure controlled and independent of the other segments of the vaporizing apparatus. The atomized droplets are preferably contained in an area away from the walls of the expansion zone by use of a gas curtain. The curtain is deployed cylindrically around the nozzle and prevents the droplets from contacting the walls of the structure and thus prevents condensation and build-up of precursor. Once the atomized droplets are carried away from the nozzle, they are forced to contact one or more modular heated contact surfaces. These heated surfaces convert the liquid droplets into vapor upon contact therewith, while those surfaces are maintained at a controllable elevated temperature. The vapor is then mixed with preheated carrier gas, preferably using flow rings, and the vapor mixture then exits the vaporizer apparatus and enters the CVD reactor chamber.

The present invention thus provides for the independent control of temperature, pressure, flow rate, and stoichiometry of the precursor vapor. The modular contact surface can not only be replaced for easy cleaning and maintenance, but it can also be replaced by a number of such modular contact surfaces, arrayed in series. Each of these units preferably has a porosity which may be varied to provide for the desired flow rates and pressure gradient leading out to the reactor interface.

BRIEF DESCRIPTION OF THE DRAWINGS

These and other features of the invention will be better understood through a study of the following detailed description of a specific embodiment of the invention, which will be more readily appreciated with reference to the drawings, in which.

DETAILED DESCRIPTION OF THE PREFERRED EMBODIMENTS

Figure 1:
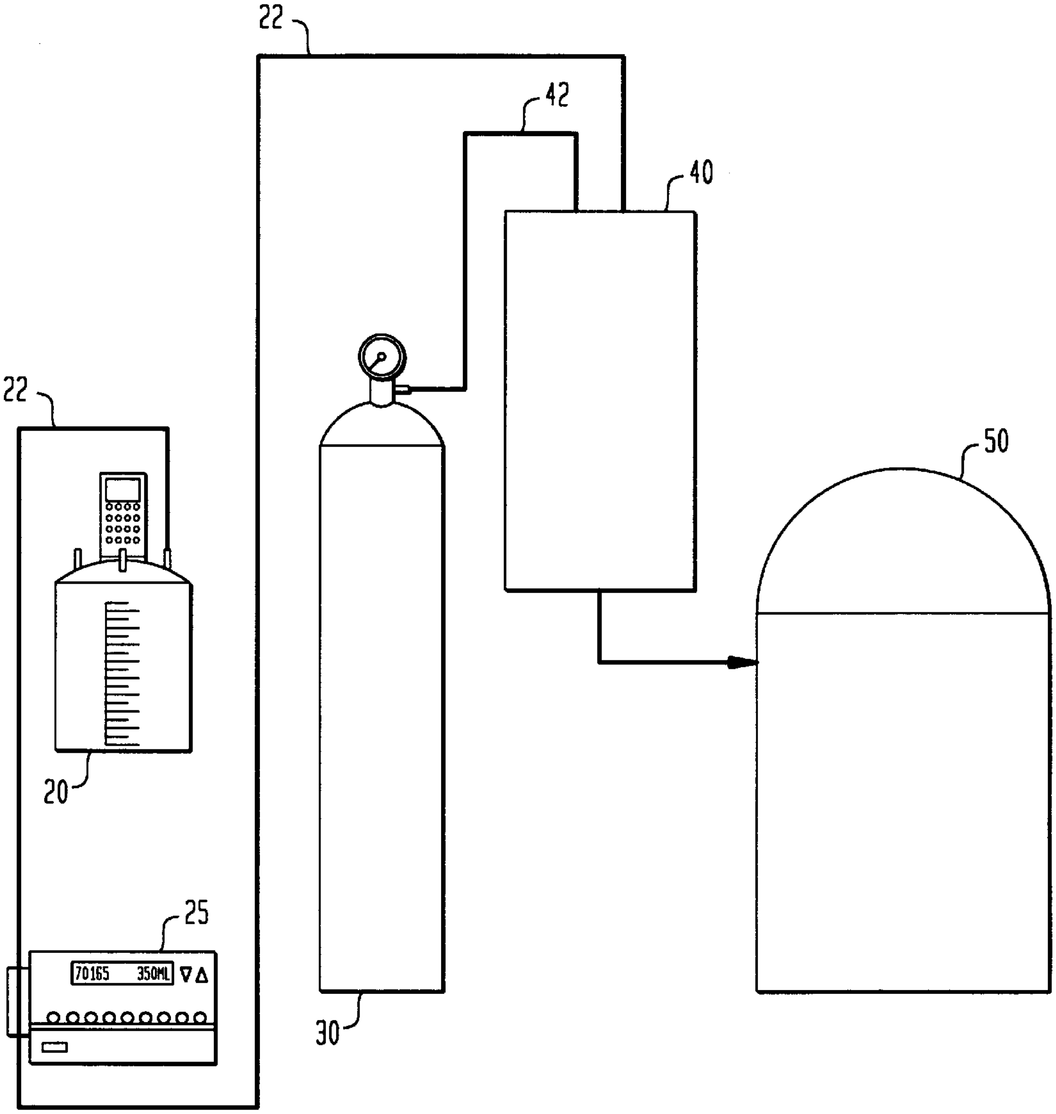
FIG. 1 is a schematic representation of a chemical vapor deposition system constructed for use in conjunction with the present invention.

There are a considerable number of liquid precursors which can be utilized in accordance with the modular apparatus of the present invention. However, the apparatus of this invention is particularly useful in connection with precursors which are based upon solid materials dissolved in various solvents, such as precursors with low volatility, high sublimation temperatures, and/or high solids contents and viscosities. Thus, a particular preferred embodiment of the present invention for use in connection with CVD reactors employs appropriate precursors to produce what are generally referred to as BST films for deposition on various substrates. Such BST (barium strontium titanates) films are thus produced from just one class of liquid precursors for use in connection with a liquid vaporizer apparatus or method of the present invention for producing a vapor for subsequent deposition such as on semiconductor wafers or the like. The present invention, however, is not limited to such BST films, but can also find significant utility in deposing a variety of other compounds for semiconductor use and the like, including, for example, the known Group III-V compound semiconductors.

The use of the term "liquid precursor" in accordance with the present invention thus requires a particular precursor determined by the nature of the film, whether it be a BST film or some other film, which is eventually to be produced in the modular CVD reactor. Furthermore, at ambient conditions, some of these precursors can be in a liquid form or in a powder form, in which case the powdered material would be dissolved in an appropriate solvent. Various solvents can be used even in connection with the normally liquid precursors, in order to dilute the specific precursor to a desired concentration therewith. This can, in fact, be a significant method of controlling deposition of the ultimate film in the modular CVD reactor.

In any event, in connection with the preferred BST films produced in accordance with the present invention, examples of precursors for the barium component can include various barium oxide compounds, for example, such as $Ba(C_{11}H_{19}O_2)_2$, which is a powder at room temperature; $Ba[(CH_3)_5C_5]_2$, which is also a powder at room temperature; $Ba(C_{10}H_{10}F_7O_2)_2$, which is also a powder at room temperature; while the strontium component can be provided by the following oxides: $Sr(C_{11}H_{19}O_2)_2$, a powder at room temperature; $Sr(C_{10}F_7H_{10}O_2)_2$, also a powder at room temperature; $Sr(C_5F_6HO_2)_2$, also a powder at room temperature; and $Sr(O_2C_{11}H_{26}N_5)_2$, a powder at room temperature. Finally, the titanium component can be provided by various titanium oxides, including $Ti(C_{11}H_{19}O_2)_3$, which is also a powder at room temperature, or compounds of the formula $Ti(OR)_4$ in which R is an alkyl group, such as ethyl, propyl, butyl or octyl, and the like. Each of these compounds is a powder or liquid at room temperature.

In addition, the present invention can also be utilized to produce other known films for semiconductor deposition, including from Group III-V and Group II-IV compound semiconductors. In this regard, conventional precursors can be utilized, such as trimethyl gallium or triethyl gallium, as well as arsines and nitrides to produce gallium arsinide and gallium nitride films, and/or metal alkyls can be utilized with the hydride or nitride of the Group V constituent in which the alkyl is TMG, TEG, or the like, and the hydride can be arsine, phosphene, or stilbene. In addition, the alkyl compound of the Group III metal compound can also include trialkyl aluminum, indium, or the like.

Depending upon the specific film which is to be deposited, the liquid precursor compound, whether the precursor is normally a powder or a liquid, can also be included in a solvent which is specifically selected based upon the particular precursor being utilized. Thus, in connection with BST films as discussed above, a number of possible solvents exist, including, for example, tetrahydrafuran (THF), isopropanol, tetraglyme, xylene, toluene, butyl acetate, and the like. It is possible for one of ordinary skill in this art to select a particular solvent for the particular liquid precursor being utilized in the apparatus or method of the present invention.

The atomizing means used for converting the liquid precursor into an atomized mist is preferably an ultrasonic spray, preferably having a frequency of from 50 to 120 kHz. The basic objective here is to produce a fine mist of the liquid precursor so that highly uniform droplets are provided. This uniformity of both size and concentration is essential in producing the highly improved results achievable with the present invention.

In a preferred embodiment of this invention, the atomizing means is a removable atomizing module which can be readily inserted into the housing of the apparatus of the present invention and removed therefrom. In this manner, the removable atomizing module can not only be replaced when it does not operate properly, needs to be refitted, or the like, but can also be replaced by an atomizing module which differs from the module which it is replacing, such as by operating at a different frequency when an ultrasonic spray is being produced therein. Thus, where, for example, a specific precursor solution which is of particularly low volatility or is to be utilized at a high flow rate is utilized, it may be necessary to employ a higher frequency ultrasonic atomizer. The particular ultrasonic device so selected will thus depend upon the frequency required in order to obtain the required uniform droplet spray at the particular conditions involved in each case.

Once the atomized mist of the liquid precursor has been prepared according to the apparatus of the present invention, vapor is produced by contact with a heated contact surface. The heated contact surface itself can take a variety of forms, but it must provide sufficient surface area to accommodate the atomized mist, while at the same time permitting the vapor produced therefrom to pass outwardly to the vapor outlet in the vaporizer apparatus hereof, to be used, for example, in a CVD reactor.

The heated contact surface is thus interposed between the atomizing means, or ultrasonic device, and the vapor outlet from the reactor. In this manner, all or substantially all of the atomized mist is forced to contact the heated contact surface at a predetermined temperature such that the vapor is produced by such direct contact, and not by being heated with high temperature gas or the like. Therefore, it is preferred to use a porous contact surface or one which has a high surface area and includes openings or passages to permit the vapor produced after such contact to exit therefrom. It is essential that these porous contact surfaces be made of material having a high thermal conductivity, in order to provide for uniform temperature distribution. It is also important that these materials have a high specific heat, in order to provide for high thermal inertia and for low transient temperature variations.

It is also important in the preferred embodiment of the apparatus of the present invention that the porous contact surface be a removable heatable contact surface which can be removably inserted into the housing at the proper location downstream of the removable atomizing module. In this manner, once again, not only can the used porous contact surfaces be replaced, but various series of such contact surfaces, both in construction and number can be utilized.

A preferred form of the heated contact surface of the present invention takes the form of one or more shaped media members or disks. Such a unit or disk can thus be produced by a porous or sintered body such as a metal body such as aluminum, nickel, or a ceramic body, such as silicon carbide (SiC). One preferred embodiment thus employs a high-porosity metal, such as a material sold under the designation CELMET by Sumitomo Electric USA, Inc. This material is a nickel or nickel chromium alloy material which has a high porosity, generally over about 90%, and a high specific surface area, as well as a high permeability without undue clogging. The material itself can be produced in sheets of various forms and sizes, and is relatively light in weight. The specific surface area of this material can vary over wide ranges, generally from about 500 $m^2/m^3$ up to 7500 $m^2/m^3$ and higher. In a preferred embodiment, a number of disks or other shaped members of this type can be aligned perpendicularly to the flow of the atomized mist to further increase the surface area in contact with the atomized particles.

As an alternative, however, it is possible to use other forms of heated contact surfaces, such as, for example, a number of grill-like or mesh surfaces stacked and relatively rotatable with respect to each other to again provide not only high surface area but high permeability for the flowing vapor as it is produced therefrom. In addition, depending upon the particular liquid precursor being utilized, the selection of the material from which the contact surface is produced can be varied to accommodate the particular substance used in the liquid precursor. The material must, however, be chemically inert to the particular liquid precursors used therewith.

Again, in each of these cases, however, in the preferred embodiment of the apparatus of the present invention, whatever type of contact media is employed must be removable from the system, and must also therefore be removably insertable into the system in any of the forms discussed above. More particularly, it is most desirable that each of these removable heatable contact surfaces be associated with a removable heating module which preferably surrounds the contact surface itself for individually heating these units in connection with this invention.

For a more detailed appreciation of the invention, attention is first invited to FIG. 1 which shows an overall schematic of a chemical vapor deposition system, including the basic external liquid delivery system with which the present invention can be utilized. FIG. 1 thus illustrates a chemical vapor deposition system which includes a liquid precursor tank 20, preferably made of stainless steel. The liquid precursor is delivered from the precursor tank 20 to the vaporizer 40 by use of a feed pump 25. The feed pump 25 draws the liquid precursor from the precursor tank 20 through a feed tube 22 in a controllable fashion, and delivers the precursor to the vaporizer 40. In view of the nature of this invention, however, it might not always be necessary to utilize such a feed pump. That is, since an ultrasonic nozzle is preferably employed herein for producing a spray or cloud of the liquid precursor, it is unnecessary to provide a high pressure stream of the liquid precursor thereto. Therefore, in some cases, it might be possible to merely employ a valve-type system to merely control the supply of liquid precursor to the ultrasonic nozzle. FIG. 1 also represents a carrier gas supply tank 30 connected to the vaporizer 40 by a feed tube 42. Typical inert carrier gases for use in the present invention include nitrogen, hydrogen, argon and helium. The vaporizer exit is connected to the chemical vapor deposition reaction chamber 50 by a feed tube 44 which carries the vaporized precursor vapor to the reaction chamber 50.

Figure 2:
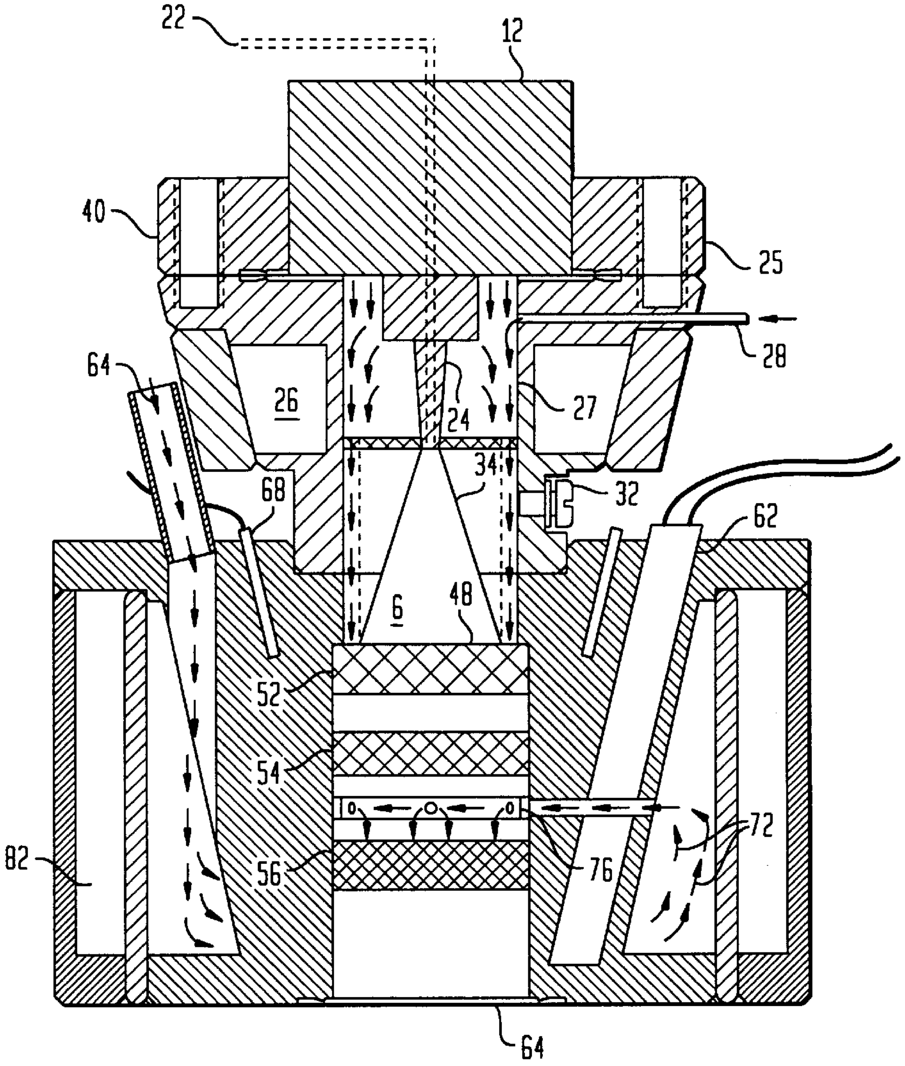
FIG. 2 is a schematic representation of the vaporizer system in one embodiment of the present invention.

FIG. 2 illustrates a schematic representation of the vaporizer apparatus 40. An ultrasonic nozzle 24 is mounted at one end of the vaporizer apparatus 40. The ultrasonic nozzle 24 receives liquid precursor from feed tube 22 mounted in an atomizer housing 12. A cooling jacket 26 surrounds the vaporizer apparatus segment where the ultrasonic nozzle 24 is housed. Thus, a coolant, preferably a cooling liquid, is fed into the cooling jacket 26 for temperature control of the ultrasonic nozzle 24. A curtain gas inlet port 28 is positioned adjacent the cooling jacket 26 and oriented perpendicularly to the ultrasonic nozzle 24 whereby the inlet port 28 inner orifice faces the base of the ultrasonic nozzle 24. This creates a curtain of gas 25, such as nitrogen or argon, descending along the walls of the vaporizer 40 as shown by the arrows in FIG. 2. A thermocouple 32 is mounted immediately adjacent to the cooling jacket 26 and is oriented perpendicularly to the ultrasonic nozzle 24 whereby the thermocouple 32 terminus faces the ultrasonic nozzle 24's effluent end. The thermocouple 32 can thus be used to control the application of coolant into the cooling jacket 26, so as to control the temperature of the atomized mist generated by the ultrasonic nozzle 24. An expansion chamber 34 extends from the ultrasonic nozzle 24 to the front face of the heated contact surface 48, in this case in the form of a series of three porous disks 52, 54 and 56, respectively. The particular heated contact surfaces 48 used in the embodiment of the apparatus of the present invention shown in FIG. 2 comprise porous metallic disks, preferably made of the CELMET material discussed above. In this embodiment, it is preferred that the disks have a decreasing porosity as one travels away from the injector, or nozzle 24. Thus, in a preferred embodiment porous disk 52 has a porosity of 10 ppm (pore per inch), porous disk 54 has a porosity of 50 ppm, and porous disk 56 has a porosity of 100 ppm.

The porous contact disks 52, 54 and 56 are contained within a vaporizing portion of the vaporizer 40, which includes heating element 62 which extends from one end of the contact surface 48 which faces the ultrasonic nozzle 24, through the opposite end of the porous contact disks 52, 54 and 56, and which terminates at a reaction chamber interface 64. In addition, a thermocouple 68 is shown which is positioned within the housing in close proximity to the heating element 62. The carrier gas heating chamber or jacket 72 surrounds the heating element 62 and channels through into an intermediate point within the heated contact surface 48. In this manner, the carrier gas from feed tube 42 (see FIG. 1) is introduced through entry port 64, circulates through the jacket 72, in which the carrier gas will be heated by its proximity to heating element 62, and then passes into the heated contact surface 48 where it can admix with the vaporized precursor material being generated therein. The flow of carrier gas thus proceeds to a flow ring 76 (see FIGS. 3*a* and 3*b*) which is positioned between individual ones of the porous contact disks. A vacuum insulator jacket 82 encompasses the entire vaporizing portion of the vaporizer 40 in order to insulate the apparatus from ambient conditions.

Figure 3A:
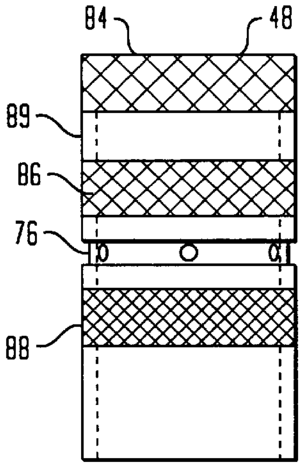
FIGS. 3*a* and 3*b* are schematic representations of a number of porous contact surfaces for use in a vaporization system in accordance with the present invention.
Figure 3B:
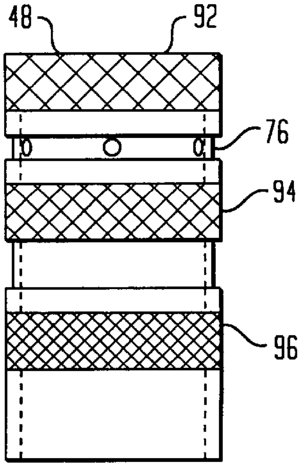

FIGS. 3*a* and 3*b* illustrate two different embodiments of the heated contact surface 48. FIG. 3*a* illustrates the use of a heated contact surface employing three porous contact disks 84, 86, and 88, aligned in series where the flow ring 76 is positioned between porous disks 86 and 88. In FIG. 3*b*, the three porous contact disks utilized are designated by reference numerals 92, 94 and 96, and flow ring 76 is positioned between porous disks 92 and 94. Note that in either orientation, as in FIG. 3*a* or 3*b*, the set of porous disks is always disposed within the portion of the vaporizer 40 which includes vaporization as depicted in FIG. 2, where the disks are facing the orifice of the ultrasonic nozzle 24.

In operation, liquid precursor is fed through feed tube 22 and is atomized by the operation of the ultrasonic nozzle 24. Once atomized in a fine liquid mist, the precursor is surrounded by curtain gas emitted through the curtain gas inlet 28. The curtain 25 of gas keeps the atomized mist from contacting the walls of the vaporizer 40 and escorts the atomized precursor mist to the heated contact surface 48 through the expansion chamber 34. The walls of the vaporizer 40 are cooled by virtue of the cooling jacket 26 to prevent premature vaporization of the atomized liquid precursor mist generated by the ultrasonic nozzle 24. This feature of the invention thus allows vaporization to take place in a specified segment of the vaporizer and provides for independent flow rate and stoichiometry adjustment due to the controlled vaporization.

Once the atomized liquid precursor mist arrives at the face of the first heated contact disk 52, it vaporizes upon contact therewith, and passes through the contact disk 52. The temperature of the heated contact surface 48 may be controlled using the heating element 62 voltage control. When the precursor vapor is between the contact disks 52, 54 and 56, it is mixed with carrier gas introduced through the flow ring 76. It is thus noted that the carrier gas travels through a preheater chamber 72 so the vaporized precursor does not experience a temperature change when it makes contact with the carrier gas. Thus, there is no threat of condensation present within the heated contact surface 48. The vapor mixture continues through the contact disks and out into the reactor 50 past interface 64. By choosing contact disks with differing porosities, the proper pressure drop can be established between the ultrasonic nozzle and the vaporizer exit.

The porosity of each contact disk is determined from a relationship between the surface area within the disk and the in-line pressure drop through the disk. The sum of the drop in pressure equals the drop required between the ultrasonic nozzle and the rest of the path distance which the precursor must travel. When the sums are equal, the nozzle is effectively isolated from the pressure at the exit of the vaporizer. The total surface area of the disk is generally chosen as a multiple of the area covered by a $1\mu$ thick layer of liquid after 1 minute of flow (area=Mult×(ml/min)/$1\mu$). Through the selection of disk porosity and thickness the proper set of contact disks for any application may be determined.

In addition to choosing the proper contact surface, the pressure drop may be controlled and adjusted with even more precision by placing the flow ring 76 between either contact disks 52 and 54, or between 54 and 56. By choosing the proper media and flow ring configuration, the pressure drop can be modified so as to establish the appropriate exit pressure.

Once the precursor vapor mixture exits the vaporizer apparatus 40, the vapor will travel to the reaction chamber 50 where the precursor will deposit onto the desired target substrate.

Reference is now made to FIGS. 4–12 herein, which relate to the preferred embodiment of the present invention. In particular, the embodiment shown in these drawings demonstrates a modular liquid vaporizing apparatus which incorporates all of the principles of the apparatus discussed above and shown in FIGS. 1–3, but in which the atomizer and the heatable contact surface are both removable modular units which can be readily inserted and removed from the apparatus and/or replaced by one or more such units, particularly in the case of with the heatable contact surface modular units. Again, in a most preferred embodiment, each one or plurality of heatable contact surfaces is associated with a removable heating module.

Figure 4:
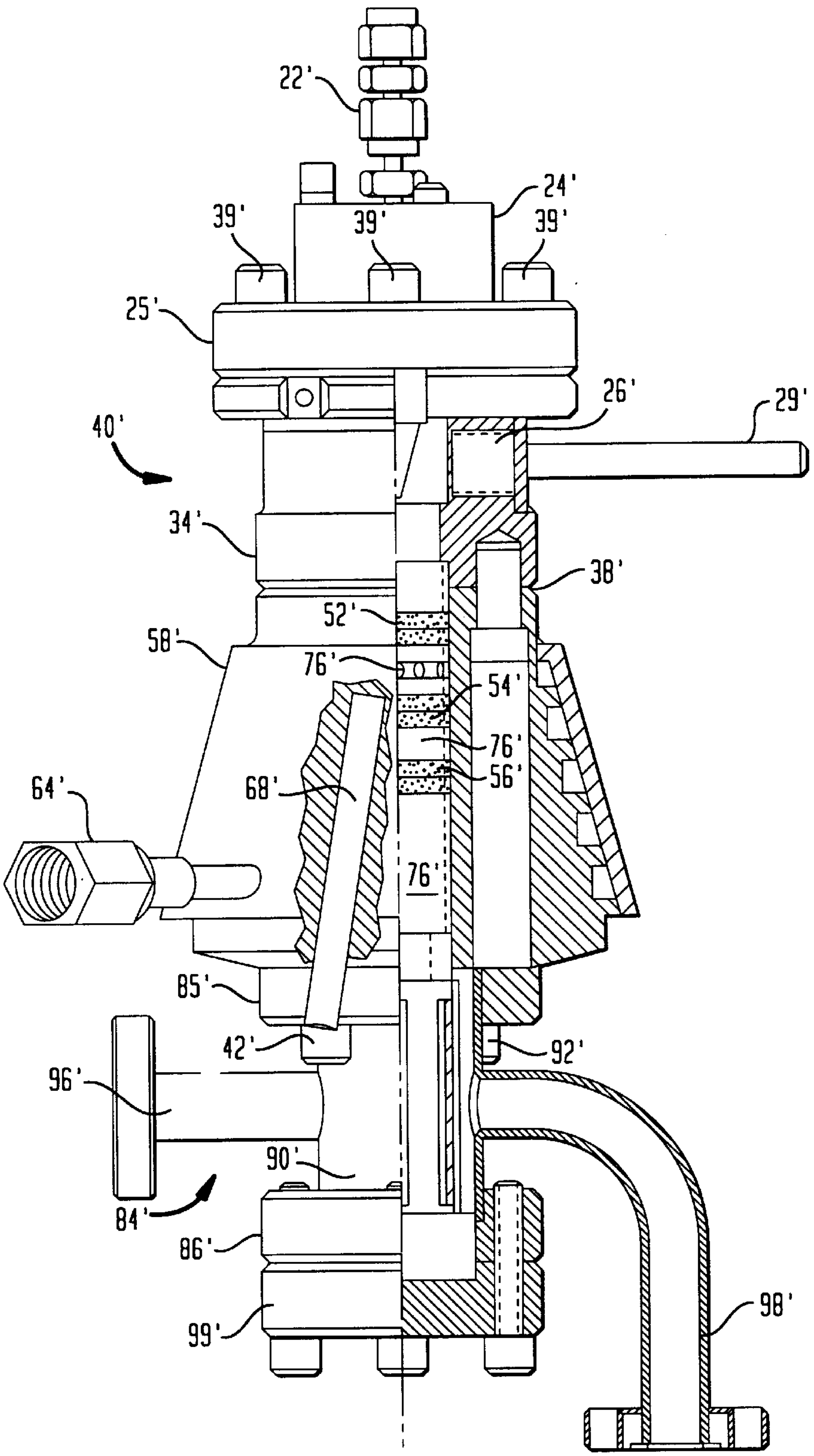
FIG. 4 is a side, elevational, partially sectional view of a modular chemical vapor deposition system in accordance with the present invention.
Figure 5A:
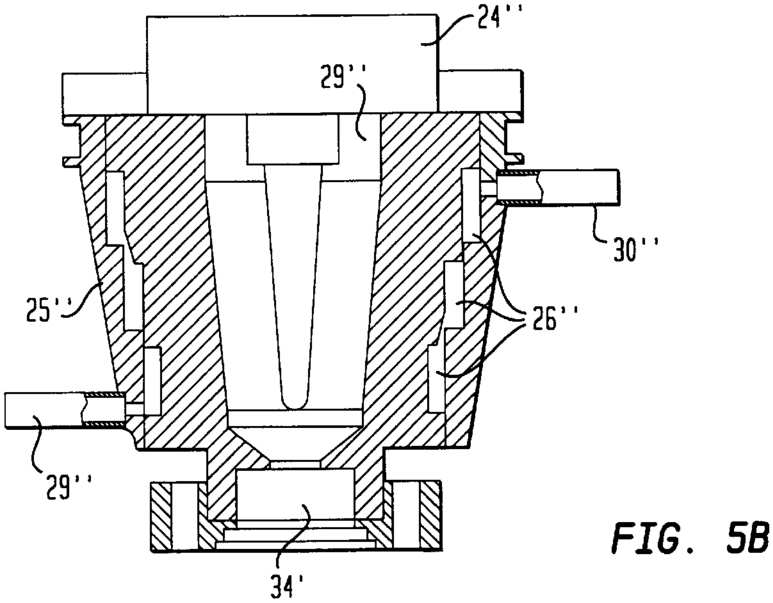
FIG. 5*a* is a side, sectional, elevational view of portion of a medium frequency ultrasonic module for use in the modular chemical vapor deposition system of the present invention.
Figure 5B:
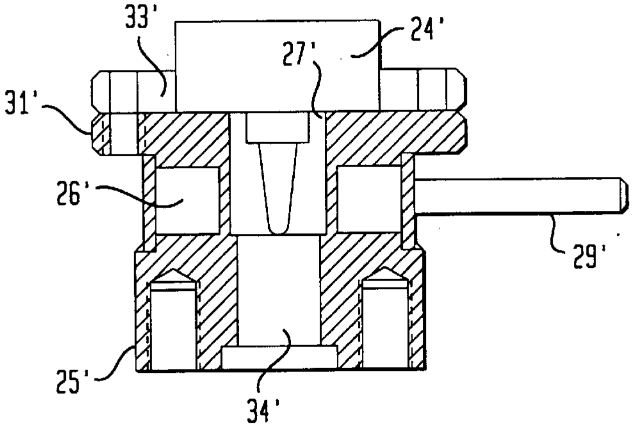
FIG. 5*b* is a side, sectional, elevational view of a portion of a high frequency ultrasonic module for use in the modular chemical vapor deposition system of the present invention.
Figure 6:
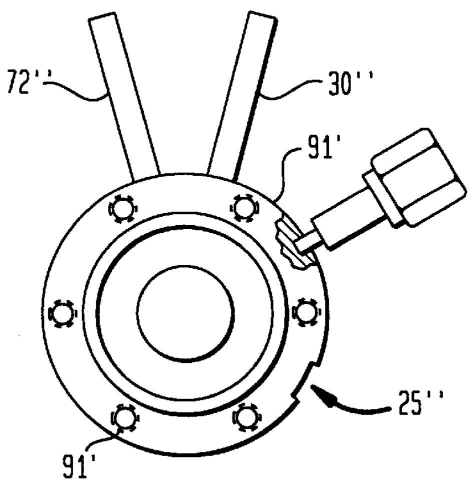
FIG. 6 is a bottom, elevational, partially sectional view of the device shown in FIG. 5*a;*
Figure 7:
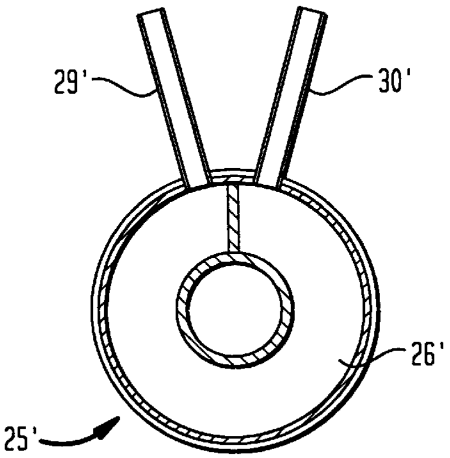
FIG. 7 is a bottom, elevational view of the device shown in FIG. 5*b;*

In this embodiment, a modular ultrasonic nozzle mounting segment 25' as shown in FIG. 4 is mounted at the upstream end of the vaporizer apparatus 40'. The construction of the ultrasonic nozzle 24' which is mounted within the nozzle mounting segment 25' (in this case, a high frequency ultrasonic nozzle) can be more specifically seen in the cross-sectional view shown in FIG. 5*b* hereof. Thus, the ultrasonic nozzle 24' again receives liquid precursor from a feed tube 22' mounted at the upstream end of the vaporizer apparatus itself. The specific high frequency ultrasonic nozzle 24' shown is FIG. 5*b* includes cooling jacket 26' which surrounds the portion of the vaporizer apparatus housing the ultrasonic nozzle 24'. Thus, a cooling liquid, such as water, is fed into the cooling jacket 26' through cooling liquid inlet 29' and cooling liquid outlet 30' (see FIG. 7) for temperature control of the ultrasonic nozzle 24'. In this respect, the nozzle mounting segment 25' and the ultrasonic nozzle 24' correspond to the nozzle mounting segment 25 and the ultrasonic nozzle 24 as shown in FIG. 2. However, a different nozzle mounting segment 25" and a medium frequency ultrasonic nozzle 24", as shown in FIG. 5*a*, can be substituted for nozzle mounting segment 25' and the high frequency ultrasonic nozzle 24' shown in FIG. 5*b*. Ultrasonic nozzle 24" in FIG. 5*a* thus includes stepped cooling jacket 26" which surrounds the elongated portion of the vaporizer apparatus housing ultrasonic nozzle 24". Thus, in this case cooling liquid, such as water, is fed into the cooling inlet 49" through the cooling jacket 26" and out of cooling outlet 30" (see FIG. 6). A curtain gas inlet corresponding to curtain gas inlet 28 shown in FIG. 2 is also part of the atomizing module, and in this regard is positioned adjacent to cooling jacket 26' and oriented perpendicularly to the ultrasonic nozzle 24' or 24", so as to face the base of the ultrasonic nozzle. In this manner, a curtain of gas such as that shown in FIG. 2 by reference numerals 27' and 27" descends along the walls of the nozzle mounting segments 25' and 25", respectively, as shown therein.

An expansion chamber 34' extends from the ultrasonic nozzle 24' to the front face of the heated contact surface as discussed below. Similarly, an expansion chamber 34" extends from the ultrasonic nozzle 24" to the front face of the heated contact surface discussed below. In both of the cases shown in FIGS. 5*a* and 5*b* it can thus be seen that the nozzle mounting segments 25' and 25", as well as the associated ultrasonic nozzles 24' and 24" mounted therein, comprise separate modular, readily removable units within the overall vaporizer systems thereof. Both of the nozzle mounting segments 25' and 25" are thus readily mounted and dismounted from the overall apparatus by means of bolts applied through bolt apertures 37' and 37" shown in FIGS. 5*a* and 5*b*. One such bolt 38' is shown in FIG. 4. Furthermore, in order to mount the ultrasonic nozzle 24' onto the nozzle segment 25', as shown in FIG. 4, it is merely necessary to bolt the peripheral flange 33' (see FIG. 5*b*) on the ultrasonic nozzle 24' to the corresponding flange 37' on the nozzle segment 25', using bolts 39' as shown in FIG. 4. In this manner, removal and replacement of the ultrasonic nozzle itself is readily facilitated.

Figure 10:
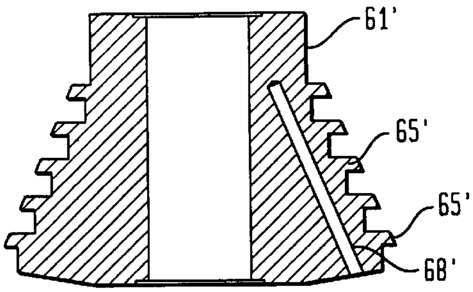
FIG. 10 is a side, elevational, sectional view of a portion of the modular chemical vapor deposition system of the present invention.
Figure 11:
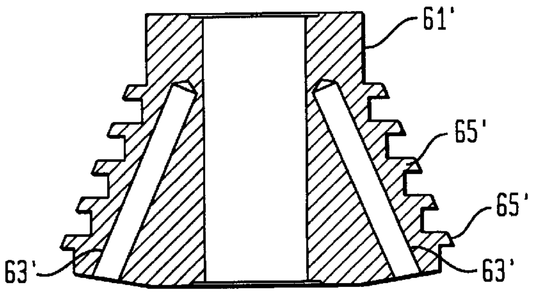
FIG. 11 is a side, elevational, sectional view of the portion of the modular chemical vapor deposition system shown in FIG. 10.
Figure 12:
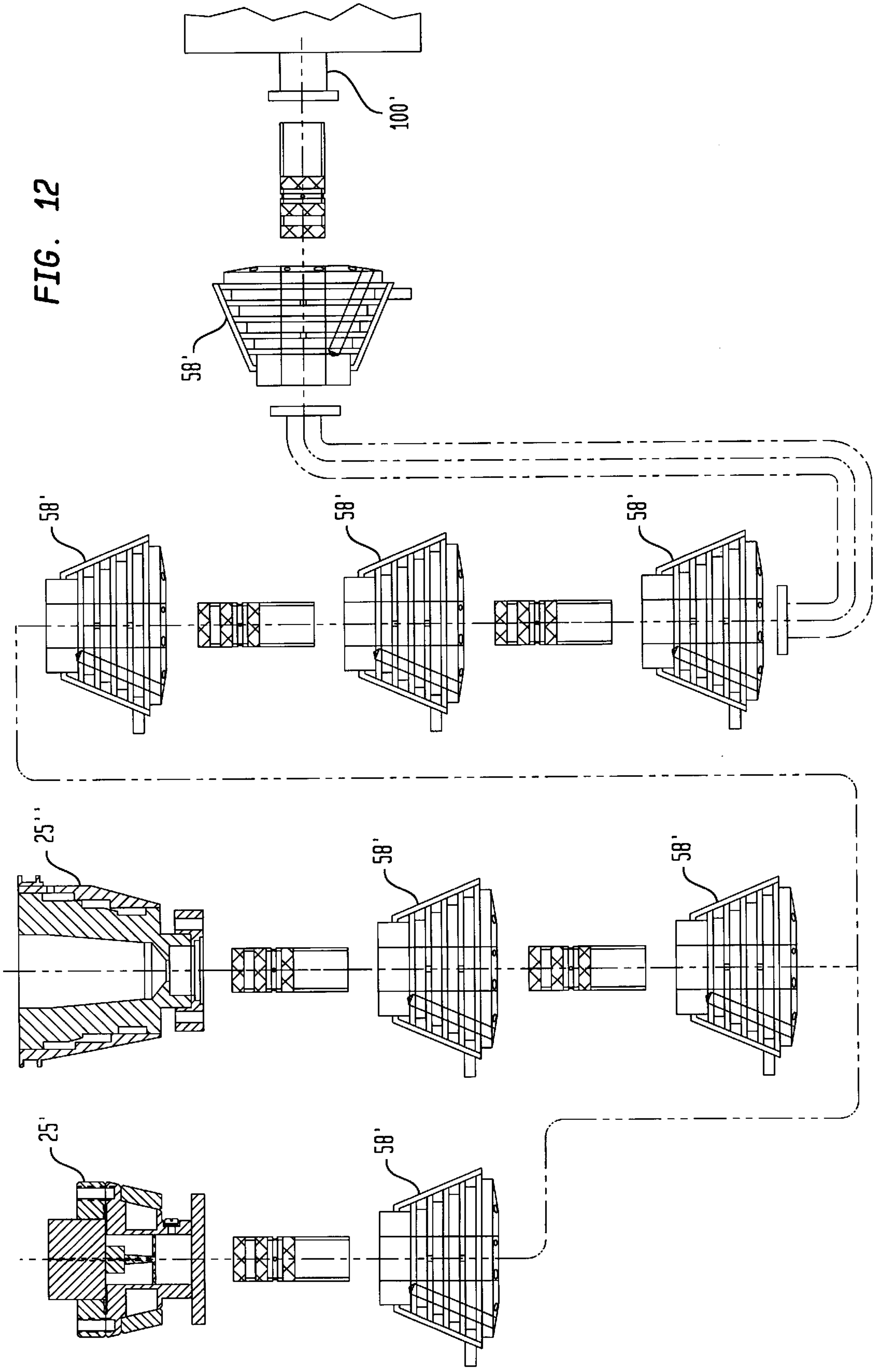
FIG. 12 is a side, elevational, schematic view of a particular arrangement of a modular chemical vapor deposition system of the present invention.

The heated contact surfaces in the case of the embodiment shown in FIGS. 4 et seq. include porous disks 52', 54' and 56', which are not only removable, but are also each contained within an evaporator unit 58'. Evaporator unit 58' is the modular heating module associated with the removable contact surfaces. Thus, evaporator unit 58', which is also shown in FIG. 8–11, surrounds the porous disks 52', 54' and 56' shown therein. Evaporator unit 58' itself includes an outer tapered wall 60' and an inner heater unit 61', as shown in FIGS. 10 and 11.

Figure 8:
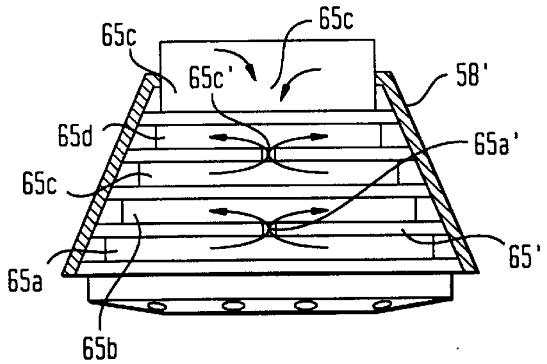
FIG. 8 is a side, elevational, partially sectional view of a portion of the modular chemical vapor deposition system of the present invention.
Figure 9:
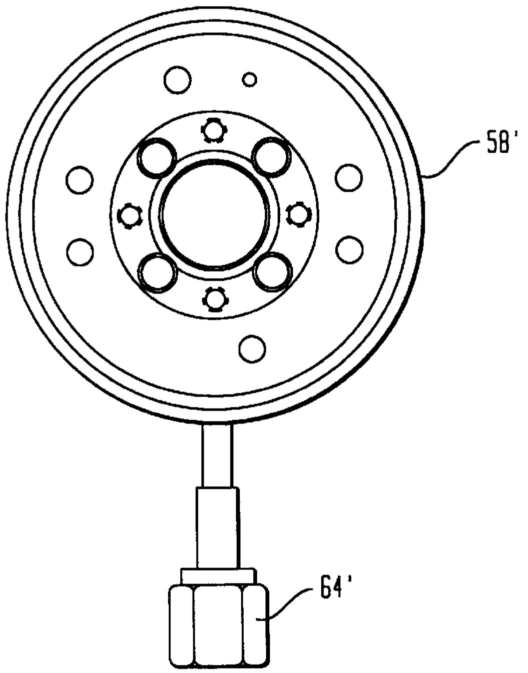
FIG. 9 is bottom, elevational view of the device shown in FIG. 8.

The modular evaporator unit 58' shown in FIGS. 4 and 8, for example, is similar to the evaporator unit 58 shown in FIG. 2. However, in at least a general sense, it is inverted; i.e., the heating elements 62' (not shown) enter the evaporator unit 58' from the bottom, into heating element slots 63', as shown in FIG. 11, as compared to the arrangement in FIG. 2, where the heating elements 62 are inserted into the evaporator unit 58 from above. In addition, the carrier gas entry port 64' is now located at the bottom of evaporator unit 58', as shown in FIG. 4, while entry port 64 in evaporator unit 58 is at the upper end thereof, as shown in FIG. 2. In addition, the evaporator unit 58' does not include a vacuum insulator jacket 82 as used in the apparatus shown in FIG. 2. Finally, a somewhat elongated space element 76' is utilized below the porous disks in FIG. 4, primarily to fill in the larger space therein. The evaporator unit 58' shown in FIG. 4, however, is a modular, easily removable unit. Once again, it is mounted to adjacent units solely by means of bolts, which are thus readily removable in order to separate these units from one another.

Additionally, a thermocouple 68' is shown in FIG. 4 being positioned within the housing in close proximity to the heating elements. Once again, this corresponds to the thermocouple 68 shown in FIG. 2. In the case of the embodiment shown in FIG. 4, the carrier gas is introduced through entrance port 64' for circulation through the evaporator unit 58' in the manner discussed below in order for the carrier gas to be heated because of its proximity to the heating elements contained in heating element slot 63', so that it can then pass into the heated contact surfaces for admixture with the vaporized precursor material being generated therein. The carrier gas can then proceed to flow between the individual porous contact disks discussed above by flowing through spacer 76' therebetween.

More particularly, referring to FIG. 8, after entry through the entrance port 64', the carrier gas passes upwardly through the various levels within the evaporator unit 58' created by inner heater unit 61' and, in particular, the series of flanges 65' extending therefrom (see FIGS. 10 and 11).

Referring specifically to FIG. 8, the flow of carrier gas through the evaporator unit 58' can be more readily seen. Thus, after entering the evaporator unit 58' through entrance port 64', the carrier gas enters each level within the evaporator unit 58' between flanges 65', thus comprising levels **65*a* through 65*e* as shown in FIG. 8. Upon entering the first level 65*a*, the gases surround the entire structure and, again as discussed above, the carrier gas is continuously heated by proximity to the heating elements contained in heating element slots 63' as shown in FIG. 11. The carrier gas can move upwardly to the next level through an aperture 65*a*' in the first flange 65' between levels 65*a* and 65*b*. The gas will then redistribute as shown by the arrows in FIG. 8 to fill the entire level 65*b*, and will then proceed upwardly to the next level 65*c* through an opening which cannot be seen in FIG. 8; i.e., it is on the opposite side of the evaporator unit 58'. Similarly, the gas then proceeds upwardly from level 65*c* to level 65*d* through aperture 65*c*', and then upwardly to level 65*e* through an aperture on the opposite side of the evaporator unit 58'. All of the carrier gas can then enter the interior of the evaporator unit 58' for mixture with the vaporized precursor material being generated therein through aperture port 65*e*' in level 65*e*. Referring to FIG. 10, which is a sectional view through the interior of the inner heater unit 61', a sectional view which is different from that of FIG. 11, showing the thermocouple slot 68' for the thermocouple, similar to the thermocouple 68 shown in FIG. 2. Again, however, the thermocouple in this case extends from the bottom of the inner heater unit 61'**.

The lower portion of FIG. 4 provides for completion of the mounting of the overall evaporative system, as well as means for connecting the unit both to exhaust and to the CVD chamber and/or additional modular units. Thus, the splitter 84' includes an upper flange 85' and a lower flange 86', as well as an intermediary body 90' therebetween. The upper flange 85' is thus bolted to the bottom of the evaporator unit 58 and to corresponding bolt apertures 91' by means of bolts 92', preferably six such bolts disposed therearound.

The intermediate portion 90' of the splitter 84' includes reactor connector 96', for attachment by means of an additional flange or other conduits to the CVD reactor itself, and exhaust conduit 98'. The lower flange 86' can thus be closed off by an end flange 99', again being bolted in the same manner discussed above, or can be connected to additional units as required.

In addition, the entire splitter arrangement 84' can be removed, and the evaporator unit 58' connected to, for example, a second evaporator unit or a number of additional evaporator units by merely bolting such units thereto in the same manner that evaporator unit 58' is bolted to the bottom of vaporizer unit 40' as discussed above. Thus, referring, for example, to FIG. 12, various modular designs can be provided by using either the high frequency or medium frequency ultrasonic nozzles 25' or 25", and a variety of evaporator units 58'; i.e., either one or more of same. Furthermore, a separate evaporator unit 58 downstream thereof can be affixed to the flow flange 100' entering the CVD reactor itself, for merely reheating the combination of precursor and heated carrier gas after it has passed through a conduit 102', in order to prevent any condensation thereof. Each of these units can again be readily mounted and/or dismounted because of their modular design, and by utilizing flanges and bolt arrangements as discussed in detail above. Furthermore, each of these evaporator units 58' includes the combination of porous disks therein as also discussed above.

Because this invention provides for independent controllability of temperature, pressure, and precursor stoichiometry it may be employed for many CVD applications requiring the use of solid or low volatility precursors. As such, this invention is not limited to microelectronic applications. Superconductors, nitride and oxide depositions are all possible by virtue of this invention.

While the above preferred embodiments of the present invention are completely described, various modifications, alternatives and equivalents may be used. Therefore, the above descriptions should not be taken as limiting the scope of the invention which is defined by the metes and bounds of the appended claims.

What is claimed is:

1. A modular liquid vaporizing apparatus comprising a housing including at least one liquid precursor supply inlet and at least one vapor outlet, a removable ultrasonic module sized for removable insertion and replacement in said housing at a location with respect to said at least one liquid precursor supply inlet, whereby said ultrasonic module can convert said at least one liquid precursor to an atomized mist, a removable heatable contact surface sized for removable insertion and replacement in said housing at a location with respect to said removable ultrasonic module whereby said heatable contact surface can vaporize said atomized mist by direct contact therewith, said housing including curtain gas entry means for supplying an unheated curtain gas to said housing for preventing said atomized mist from contacting the inner walls of said housing and for preventing vaporization of said atomized mist prior to contact with said removable heatable contact surface and for transporting said atomized mist to said removable heatable contact surface, whereby a vapor can be supplied from said at least one vapor outlet.

2. The apparatus of claim 1 including a removable heating module sized for removable insertion and replacement in said housing in association with said removable heatable contact surface whereby said removable heating module can raise the temperature of said removable heatable contact surface.

3. The apparatus of claim 2 including a plurality of said removable heatable contact surfaces and a corresponding plurality of said removable heating modules each sized for removable insertion and replacement in in series within said housing for sequentially vaporizing said atomized mist.

4. The apparatus of claim 3 wherein each of said plurality of removable heating modules includes a thermocouple for monitoring the temperature of said plurality of heating modules.

5. The apparatus of claim 2 wherein said removable heating module includes a flange for connecting said removable heating module to said atomizing module.

6. The apparatus of claim 5 including a plurality of said removable heating modules wherein said plurality of removable heating modules includes a flange for connecting said plurality of removable heating modules to said removable atomized module or to another of said plurality of removable heating modules.

7. The apparatus of claim 1 wherein said removable heatable contact surface comprises at least one porous contact member.

8. The apparatus of claim 7 wherein said at least one porous contact member comprises at least one porous disk.

9. The apparatus of claim 1 including a plurality of said removable heatable contact surfaces comprising a plurality of porous contact members.

10. The apparatus of claim 9 wherein said plurality of porous contact members comprises a plurality of porous disks.

11. The apparatus of claim 9 wherein said plurality of porous contact members vary in porosity whereby a pressure gradient is formed between said housing and said at least one vapor outlet.

12. The apparatus of claim 1 including means for connecting said at least one vapor outlet to a CVD reaction chamber.

* * * * *

UNITED STATES PATENT AND TRADEMARK OFFICE

CERTIFICATE OF CORRECTION

PATENT NO. : 5,835,678

DATED : November 10, 1998

INVENTOR(S) : Li et al.

It is certified that error appears in the above-identified patent and that said Letters Patent is hereby corrected as shown below:

In the Abstract, line 15, "into CVD" should read --into a CVD--.

Column 2, line 27, "disperse" should read --disperses--.

Column 5, line 38, "In" should read --If--.

Column 5, line 39, delete "and".

Column 6, line 49, "of portion" should read --of a portion--.

Column 13, line 11, "FIG." should read --FIGS.--.

Column 15, line 31, delete "in" (first occurrence).

Signed and Sealed this

Thirtieth Day of March, 1999

Attest:

Q. TODD DICKINSON

*Attesting Officer*

*Acting Commissioner of Patents and Trademarks*